Figure 1:
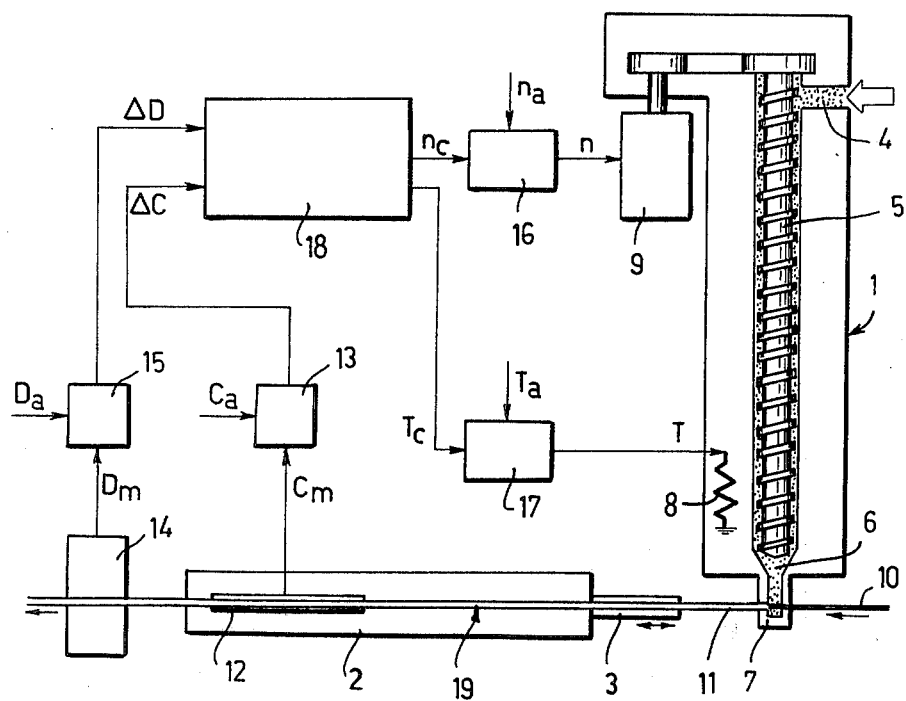

United States Patent [19]

Kirjavainen

[11] 4,257,991

[45] Mar. 24, 1981

[54] METHOD OF AND A REGULATOR FOR ADJUSTING THE CAPACITY AND THE DIAMETER OF AN ELECTRIC CONDUCTOR

[75] Inventor: Kari J. Kirjavainen, Helsinki, Finland

[73] Assignee: Oy Nokia AB, Finland

[21] Appl. No.: 974,559

[22] Filed: Dec. 29, 1978

[30] Foreign Application Priority Data

Jan. 2, 1978 [FI] Finland .................................. 780004

[51] Int. Cl.$^3$ ........................ B29D 27/00; B29F 3/10; G01B 21/12; G01N 27/22
[52] U.S. Cl. .................................. 264/40.6; 264/40.2; 264/40.7; 264/45.9; 264/174; 425/113; 425/141; 425/144; 425/817 C
[58] Field of Search ..................... 264/45.9, 40.2, 124, 264/40.7, 40.6; 425/113, 141, 144, 817 C

[56] References Cited

U.S. PATENT DOCUMENTS

| | | | |
|---|---|---|---|
| 2,804,592 | 8/1957 | Biskeborn | 264/40.2 X |
| 3,185,924 | 5/1965 | Locher | 264/40.2 X |
| 3,288,895 | 11/1966 | Windeler | 264/40.2 |
| 3,459,851 | 8/1969 | MacPherson | 264/40.2 |
| 3,502,752 | 3/1970 | Brown | 264/40.2 |
| 3,914,357 | 10/1975 | Cereijo et al. | 264/40.2 |

FOREIGN PATENT DOCUMENTS

2422052 12/1974 Fed. Rep. of Germany .......... 264/40.2

*Primary Examiner*—Philip Anderson
*Attorney, Agent, or Firm*—Finnegan, Henderson, Farabow, Garrett & Dunner

[57] ABSTRACT

A method of and a device for adjusting the capacity and the diameter of an electric conductor provided with an insulation coating of foamed plastics material in an extruder press. The press is provided with an adjustably rotating feed screw and adjustable heating means. The deviation of the capacity of the insulated conductor from a preset capacity and the deviation of the diameter of said conductor from a preset diameter are measured at the path of movement of the conductor. The rotation speed of said screw is adjusted in response to said capacity deviation and said diameter deviation and the temperature of said heating means is also adjusted in response to said capacity variation and said diameter deviation in order to correct said deviations.

4 Claims, 4 Drawing Figures

CONDUCTOR CAPACITY
AND DIAMETER
DEPENDENCY OF
CONDUCTOR SPEED,
PRESS SCREW
ROTATION SPEED
AND PRESS
TEMPERATURE

METHOD OF AND A REGULATOR FOR ADJUSTING THE CAPACITY AND THE DIAMETER OF AN ELECTRIC CONDUCTOR

The present invention relates to coating of an electric conductor with an insulation of foamed plastics in a cable insulation line. A bare wire is passed from a starting coil to a drawing machine where the wire is thinned to the required diameter dimension. Hereafter the wire is softened anew by annealing. Next, the wire is passed through a plastics extrusion head in which the actual coating with plastics of the wire takes place. The plastics extruder press comprises a long hollow cylinder in which a rotary screw is provided. Grains of plastics are fed into the cylinder at one end, said grains being advanced through the cylinder as the screw is rotating. By means of combined heating and cooling elements provided around the cylinder the temperature of the plastics can be adjusted as required. Under the influence of the pressure and mixing effect produced by the rotation of the screw and under the influence of the temperature, the plastics melts into a uniform mass. The extrusion head through which the wire is passed forms an extension of the cylinder. At the extrusion head the plastics forms a uniform mantle around the wire. The wire coated with hot plastics is passed into a cooling channel in which the plastics coating is cooled by means of water jets. The cooling channel is connected to a displaceable cooling means or telescope, the distance of which from the outlet of the extrusion head is adjustable. The cooled insulated conductor is finally coiled on a coil. The insulation of the wire is a continuous process in which the speed of the wire in the insulation line can be, for example, 40 m/s. The capacity of the insulated conductor is measured by means of a sensor in the cooling channel, and the diameter of the conductor is measured after the cooling channel but before coiling. The capacity is the most important property of the conductor affecting, among other things, the transmission properties and the overhearing when using the conductor for telephone lines.

Plastics insulation refers to foamed plastics containing gas pubbles produced by foaming. The proportion of gas in the insulation volume, i.e. the degree of foaming depends on the temperature of the plastics as it leaves the press and on the starting point of the cooling. The quantity of plastics discharged from the press depends on the rotation speed of the screw.

It is previously known to adjust the diameter of the insulated conductor by means of the rotation speed of the screw and/or the speed of the wire and to adjust the capacity of the insulation by means of the temperature of the plastics mass. Another way is to adjust the capacity by means of the rotation speed of the screw and to adjust the diameter by means of the temperature of the plastics mass. In addition, it is known to use a telescope to adjust the degree of foaming.

The rotation speed of the screw affects both the diameter and the capacity of the insulation, and the temperature of the plastics mass affects also, by affecting the degree of foaming, both the diameter and the capacity of the insulation. In the above mentioned known adjusting methods, this combined effect is not taken into account, but a correction of an error in the diameter or capacity by means of an adjustment of the rotation speed of the screw or the temperature of the plastics mass causes an error in one or the other, i.e. in the capacity or the diameter, respectively.

It is the object of this invention to provide a method which eliminates the above mentioned disadvantages and makes it possible to adjust the capacity and the diameter of an insulated conductor in a more reliable way corresponding better to the actual situation. This object is achieved by means of a method according to the invention which is characterized in that the rotation speed of said feed screw is adjusted in response to said capacity deviation as well as in response to said diameter deviation, and the temperature of said heating means is adjusted in response to said capacity deviation as well as in response to said diameter deviation.

The method according to the invention is based on the idea that a deviation observed in the capacity or the diameter of a conductor is in both cases caused to bring about a simultaneous correction both in the rotary speed of the screw and the temperature of the mass, which factors both affect the capacity as well as the diameter. In this way, the combined effect of both these factors on the capacity and the diameter can be taken simultaneously into account in the process, thereby avoiding that adjustments of both said factors required for correcting, for example, a deviation observed in the conductor capacity, in turn, result in a deviation of the conductor diameter. If, on the other hand, an error is noted simultaneously both in the capacity and the diameter, the correcting adjustments of both said factors can be mutually selected so as to have the required correcting effect at the same time both on the capacity and the diameter.

The invention will be described in the following in more detail with reference to the accompanying drawings, in which FIG. 1 is a schematic view of a conductor insulation line.

Figure 2:
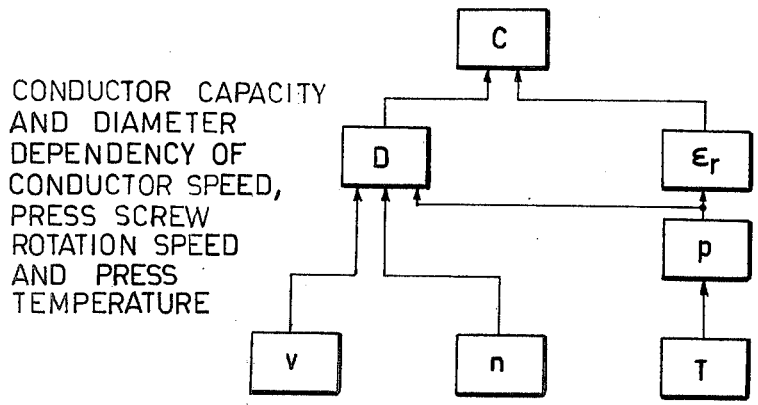
Figure 3:
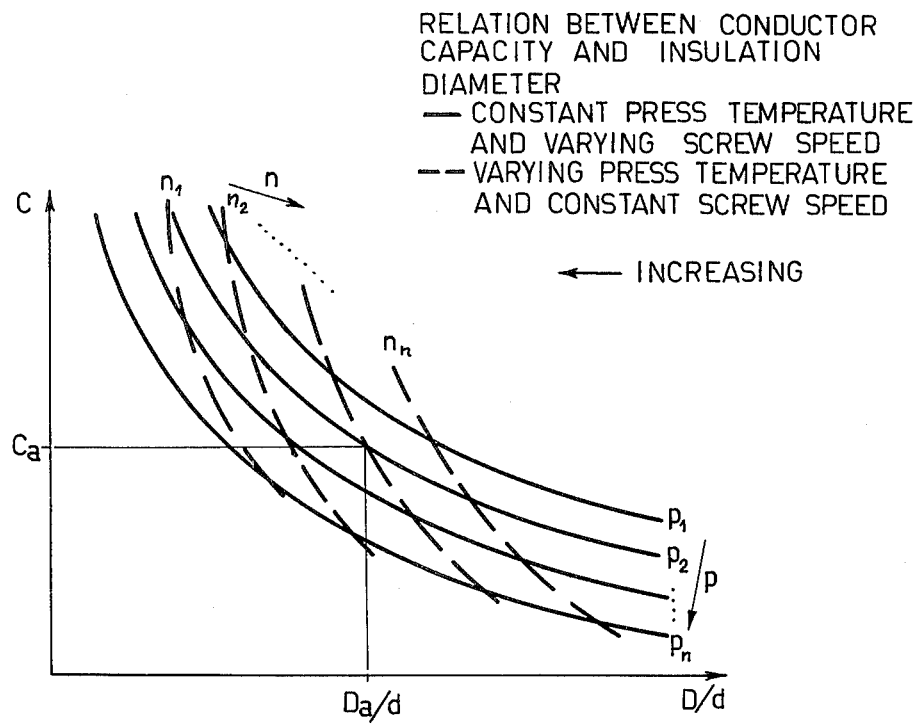
Figure 4:
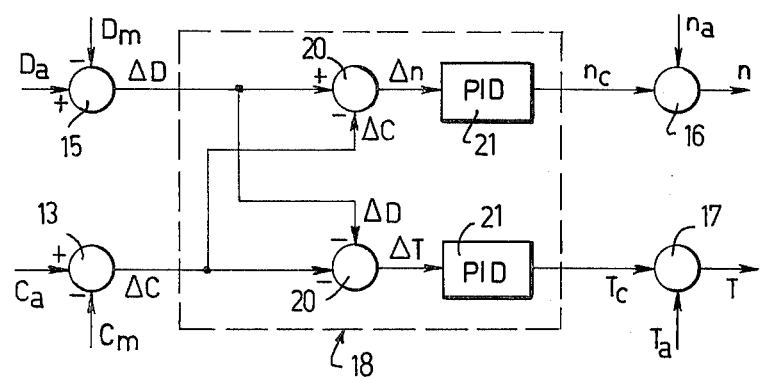

FIG. 2 is a view of the mutual dependencies of the main variables in a conductor insulation process, FIG. 3 is a graphical view of the dependency of the conductor capacity on the conductor diameter and the degree of foaming of the conductor insulation, and FIG. 4 is a schematical view of the principle of a regulator according to the invention.

The insulation line shown in FIG. 1 of the drawing comprises mainly a plastics extruder press 1, a cooling channel 2 and a telescope 3. The plastics extruder press is provided with an inlet 4 for plastics raw material and a feed screw 5 feeding a plastics mass to an extrusion head 7 of the extruder press. The extruder press is provided with heating and cooling means represented in the drawing by a heater 8 by means of which the temperature of the molten plastics mass is adjusted as required as the mass moves to the head 7. The feed screw is rotated by an electric motor 9.

A wire 10 to be coated is passed through the extrusion head 7 in which a uniform insulation mantle 11 is formed around the wire. Said cooling channel 2 and telescope 3 are mounted on the path of movement of the wire. In the cooling channel, a capacity sensor 12 is mounted on the path of movement of the conductor for measuring the conductor capacity, and a capacity monitor 13 is connected to said sensor. After the cooling channel, also on the path of movement of the conductor, is mounted a diameter sensor 14 for measuring the outer diameter of the conductor, said sensor being connected to a diameter monitor 15.

FIG. 1 of the drawing, in addition, shows a speed regulator 16 controlling the number of revolutions of the motor 9, a thermoregulator 17 regulating the temperature of the heater 8 of the press, and a regulator 18 described more closely in the following.

The capacity and diameter monitors 13 and 15, respectively, are given set values $C_a$ and $D_a$, and the values $C_m$ and $D_m$ measured by means of the sensor 12 and the sensor 14 are fed to the monitors. The deviation values $\Delta C$ and $\Delta D$ of the capacity and the diameter obtained from the monitor are fed to the regulator 18. The regulator, in turn, provides corrections $n_c$ and $T_c$ for the rotation speed of the screw and for the mass temperature, respectively. The cylinder of the plastics extruder press 1 is preferably divided into several zones the temperatures of which are individually adjustable. In general, the temperature increases in the direction toward the outlet of the extruder press. The extrusion head 7 is also provided with a heating unit of its own. The temperature in the last zone and in the head has the most intense effect on the foaming, and these temperatures are utilized in the adjustment. These temperatures are given a suitable set value $T_a$. The regulator 17 makes said correction $T_c$ with respect to this set The regulator 17 makes said correction $T_c$ with respect to this set value. Similarly, the rotation speed of the screw has a suitable set value $n_a$ which is dependent on the wire speed and the regulator makes said correction $n_c$ to this set value.

A foaming agent is mixed in the foam plastics raw material and this agent forms in the press incipient bubbles. As the plastics is discharged from the extruder press and is relieved of pressure, the gas in the incipient bubbles expands until the plastics is cooled to a solid state and the expansion of gas ceases. The number of incipient bubbles produced in the plastics is proportional to the plastics temperature. FIG. 2 illustrates the mutual dependency of the various factors. The rotation speed of the screw n and the wire speed v affects the plastics quantity, i.e. the diameter D which, in turn, has an effect on the capacity C. The plastics temperature T affects the degree of foaming p, having an effect on the capacity, because the relative permittivity of the insulation changes and on the diameter D because the gas quantity in the insulation changes. The degree of foaming affects also the capacity due to the changes in the diameter.

The dependency of the capacity C of the insulated conductor on the conductor diameter D, the conductor diameter d and on the relative permittivity $\epsilon_r$ of the insulation can be expressed by means of the following equation:

$$C = \frac{2 \cdot \pi \cdot \epsilon_o \cdot \epsilon_r}{\ln (D/d)} \quad (1)$$

In the equation (1), $\epsilon_o$ is the dielectric constant.

The relative permittivity $\epsilon_r$ is dependent on the foaming degree p of the plastics as follows when the plastics is polyethylene having a relative permittivity of about 2,3 and the relative permittivity of air is 1:

$$\epsilon_r = 2,3 - 1,3p \quad (2)$$

FIG. 3 shows the conductor capacity C as a function of the conductor diameter relation D/d and the degree of foaming p. In the Figure, the capacity is indicated by solid lines when the foaming degree remains constant. When the rotation speed of the screw and temperature remain unchanged, the process takes place on these lines. The broken lines illustrate the capacity as a function of the diameter relation when the rotation speed of the screw is constant, but the degree of foaming is changed by varying the temperature. The dependency of the diameter D on the rotation speed n of the screw, the conductor speed v, the foaming degree p and on the conductor diameter d is expressed by the following equation:

$$D = \left( \frac{4 \cdot K \cdot n}{\pi \cdot v \cdot (1 - p)} + d^2 \right)^{\frac{1}{2}} \quad (3)$$

in which K is a constant characteristic to the plastics extruder press.

A good result can not be obtained by means of previously known regulators in which, for example, the capacity is adjusted by means of the temperature and the diameter is adjusted by means of the rotation speed of the screw.

In a situation where the diameter is correct and the capacity too high, a deviation observed in the capacity causes a correction raising the temperature. The increase in the temperature results in an increase in the foaming degree p, whereby the process shifts from an upper solid line in FIG. 3 to a lower solid line along a broken line. This shows that at the same time as the capacity deviation is corrected the diameter becomes too big. Correspondingly, in a situation where the capacity is correct and the diameter is too small, the rotation speed of the screw is increased whereby the value of the diameter is corrected, but a deviation occurs in the capacity. In a situation where there is a deviation both in the capacity and in the diameter, several corrections must be made in the temperature and in the rotation speed of the screw before the correct values are found for them experimentally and, due to the slow heat regulation, an incorrect correction of the temperature may lead to an even more difficult situation.

In the known systems, in which the capacity is adjusted by means of the rotation speed of the screw and the diameter is adjusted by means of the plastics temperature, a too high capacity increases the rotation speed of the screw and a too big diameter raises the plastics temperature.

In the adjustment according to the present invention the above mentioned adjustment methods are combined. The principle of operation of the regulator is illustrated in FIG. 4. The corrections caused by the regulator can be expressed by the following equations:

$$\Delta T = -(C_a - C_m) - (D_a - D_m) \quad (4)$$

$$\Delta n = -(C_a - C_m) + (D_a - D_m) \quad (5)$$

From FIG. 3 it is seen that the required set values $C_a$ and $D_a$ for the capacity and for the diameter respectively are achieved with a single value of the rotation speed of the screw and with a single value of the foaming degree, i.e. of the temperature of the plastics mass. While operating on the solid lines, the foaming degree thus remains constant and while operating on the broken lines, the plastics quantity remains constant. In the adjustment, it is thus a question of finding the correct values for the rotation speed of the screw and for the temperature. In previous regulators, a deviation in the capacity or in the diameter has resulted in a correction in only one of the factors to be adjusted, and the correction of the other factor has taken place only by means of a feedback from the process, i.e. the deviation in one magnitude was corrected and an error produced in the other one, etc.

By means of the new regulator, the necessary corrections take place immediately both in the rotation speed of the screw and in the temperature, whereby the correct values for these are found more rapidly. When the rotation speed of the screw or the temperature has a correct value, the corresponding member in the equations 4 and 5 will have the value zero and no unnecessary corrections will be made in the process.

Assume as an example a situation where both the capacity and the diameter are too big. In this case, the plastics quantity is too big and the foaming degree is too low. From the equations 4 and 5, a positive correction is obtained for the temperature and, in the beginning, a zero correction for the rotation speed of the screw. Owing to the fact that the capacity deviation decreases as the temperature increases, a negative correction is obtained for the rotation speed of the screw. On the other hand, assume a situation where the capacity is too high and the diameter is too small or, according to FIG. 3, the degree of foaming is nearly correct and the plastics quantity is too small. Now, from equations 4 and 5, a zero correction is obtained for the temperature and a positive correction for the rotation speed of the screw.

The instruments and devices included in the equipment according to FIG. 1 can be, for example, as follows (manufacturer/type):

| | |
|---|---|
| plastics extruder press 1: | Oy Nokia Ab/Mp 60 24 D |
| cooling channel 2: | Oy Nokia Ab/JR 33-13-5 TME |
| diameter sensor 14: | BETA Instrument Company Ltd/ LG 1010 |
| diameter monitor 15: | BETA Instrument Company Ltd/ LI 700 |
| capacity sensor 12: | BETA Instrument Company Ltd/ KG 250 |
| capacity monitor 13: | BETA Instrument Company Ltd/ KI 700 |
| screw rotation speed regulator 16: | Oy Stromberg Ab/SMEK 380A40/E |
| screw motor 9: | Oy Stromberg Ab/GNAU 3621 32 kW 440 V, 80A |
| thermoregulator 17 + power unit: | Oy Nokia Ab/T101 + P101 |
| calculator 20: | } Oy Nokia Ab/MU 601-04-01 |
| PID-regulator 21: | |

The regulator 18 shown in FIG. 4 includes two calculators 20 performing subtractions and additions required by the formulas (4) and (5) and two PID-regulators programmed according to the formulas (1) and (3). The calculators 20 transmit the calculated reference values $\Delta n$ and $\Delta T$ to the regulators 21 which, on the basis of their programmes, calculate the final correction values $n_c$ and $T_c$ required for correcting the observed capacity and/or diameter deviations. Thus, the regulators calculate on the basis of the reference values by which number of revolutions and by which temperature the process can be adjusted to the correct set values while taking into account the opposite effects of the changed number of revolutions and the changed temperature on the process as a whole.

EXAMPLE 1

Assume a situation where the required values are: the diameter of the insulated conductor $D_a = 0.7$ mm, the capacity of the insulated conductor $C_a = 180$ pF/m, the wire diameter $d = 0.4$ mm, and the wire speed $v = 2000$ m/min. The Temperature T in the last zone and in the head of the plastics extruder press = 220° C. At this temperature, the foaming degree p is = 0.41 (41%) and the number of revolutions of the screw = 42 1/s. The experimental value of the constant K characteristic to the extruder press is $7.10^{-6} m^3$.

The conductor capacity $C_m$ measured by means of the capacity sensor 12 is 180 pF/m, i.e. $C_m = C_a$. The diameter $D_m$ of the insulated conductor measured by means of the diameter sensor 14 is 0.69 mm, i.e. it deviates from the set value $C_a$. In this case, the $\Delta C$-terms in the adjusting equations (4) and (5) are zero, whereby $\Delta T = -\Delta D$ and $\Delta n = +\Delta D$.

As $\Delta D = D_a - D_m = 0.01$ mm, the reference values for the corrections given by the calculators are $\Delta T = -0.01$ and $\Delta n = +0.01$. With these values, depending on the tuning of the regulator 21, the following final correction values are obtained: $T_c = -3°$ C., which results in a value $p_c = -3\%$, and $n_c = +4 1/s$. The final correction of the screw speed is big due to the fact that a decrease in the temperature has an increasing effect on the diameter.

$$D_m = \left( \frac{4 \cdot 7 \cdot 10^{-6} \cdot 46}{\pi \cdot 2000 (1 - 0{,}38)} + (0{,}4)^2 \right)^{\frac{1}{2}}_{mm} = 0.70 \text{ mm}$$

$$C_m = \frac{2 \cdot \pi \cdot \epsilon_o \cdot (2{,}3 - 1{,}3 \cdot 0{,}38)}{\ln (0{,}70/0{,}4)} \text{ pF/m} = 180 \text{ pF/m}$$

If only the rotation speed of the screw had been corrected according to $n_c = 4 1/s$, the values $D_m$ = approximately 0.71 mm and $C_m$ = approximately 171 pF/m would be obtained.

EXAMPLE 2

The required values are the same as above. The measured values $D_m$ and $C_m$ are 0.71 mm and 175 pF/m, respectively, whereby p = 38% and T = 217° C. and n = 48 1/s.

From the regulating equations (4) and (5) are obtained the corrections:

$\Delta T = -\Delta C - \Delta D$ and $\Delta n = -\Delta C + \Delta D$, whereby $\Delta C = (180-175)$ pF/m = +5.0 pF/m and $\Delta D = (0.70 - 0.71)$ mm = -0.01 mm.

Now the reference value $\Delta T$ for the temperature correction will be the difference of the absolute values of the capacity and the diameter deviations, whereby the correction value $T_c$ obtained from the regulator 21 will be zero or very small. The reference value $\Delta n$ for the rotation speed of the screw is the sum of the absolute values. With a correction value $n_c = 2^1/s$ given by the regulator 21, the values $C_m = 180$ pF/m and $D_m = 0.7$ mm are obtained.

If the temperature has been corrected by means of the capacity deviation only and the rotation speed of the screw by means of the diameter deviation only, the corrections being for example $T_c = -2°$ C., which results in $p_c = -2\%$, and $n_c = -1^1/s$, the values $D_m = 0.70$ mm and $C_m = 183$ pF/m would be obtained, i.e. the diameter will be corrected, but the unnecessary temperature correction causes a too high capacity.

What we claim is:

1. A method of adjusting the capacity and the diameter of an electric conductor (19) comprising a metal wire (10) and an insulation (11) of foamed plastics material provided around said wire in an extruder press (1) which includes an adjustably rotating feed screw (5) for supplying foamable plastics material through an extrusion head (7) through which the wire is passed, and adjustable heating means (8) for heating said foamable plastics material; comprising the steps of:

measuring the conductor capacity ($C_m$) of the insulated conductor (19) downstream of said extrusion head (7) and generating a signal related thereto, comparing said measured conductor capacity signal with a signal related to a predetermined conductor capacity ($C_a$) and generating a signal related to the deviation ($\Delta C$) therebetween;

measuring the diameter ($D_m$) of the insulated conductor (19) downstream of said extrusion head (7) and generating a signal related thereto, comparing said measured conductor diameter signal with a signal related to a predetermined diameter ($D_a$) and generating a signal related to the deviation ($\Delta D$) therebetween;

utilizing both of the signals related to the deviations ($\Delta C$) and ($\Delta D$) to adjust the rotation speed (n) of said feed screw (5); and utilizing both of the signals related to the deviations ($\Delta C$) and ($\Delta D$) to adjust the temperature (T) of said heating means (8).

2. The method as claimed in claim 1, the rotation speed (n) of said feed screw (5) and the temperature (T) of said heating means (8) being increased at a capacity deviation ($\Delta C$) indicating a bigger capacity than the predetermined conductor capacity ($C_a$) and vice versa, the rotation speed (n) of said feed screw (5) being increased and the temperature (T) of said heating means being decreased at a diameter deviation ($\Delta D$) indicating a smaller diameter than the predetermined conductor diameter ($D_a$) and vice versa.

3. In a device for extruding an insulation (11) of a foamed plastics material around a metal wire (10) to form an electric conductor (19) of the type which includes an extrusion head (7) positioned along the path of movement of said wire (10), a rotating feed screw (5) supplying a foamable plastics material (6) to said extrusion head, (7), means for adjusting the rotation speed (n) of said feed screw (5), heating means (8) for heating the foamable plastics material (6) to an extrudable state in said extrusion head (7), and means for adjusting the temperature of said heating means; the improvement which comprises a capacity measuring means (12) downstream of said extrusion head (7) and operable to measure the conductor capacity ($C_m$) of the insulated conductor (19) and to generate a signal related thereto, a capacity monitoring means (13) operable to receive said signal from said capacity measuring means (12) and to compare it with a signal related to a predetermined conductor capacity ($C_a$) and to generate a signal related to the deviation ($\Delta C$) therebetween, a diameter measuring means (14) downstream of said extrusion head (7) and operable to measure the diameter ($D_m$) of the insulated conductor (19) and to generate a signal related thereto, a diameter monitoring means (15) operable to receive said signal from said diameter measuring means (14) and to compare it with a signal related to a predetermined conductor diameter ($D_a$) and to generate a signal related to the deviation ($\Delta D$) therebetween and regulating means (18) operable in response to both of the signals related to the deviations ($\Delta C$) and ($\Delta D$) to adjust both the rotation speed (n) of said feed screw (5) and the temperature (T) of said heating means (8).

4. The improvement as claimed in claim 3, said adjusting means (18) being operable to adjust the rotation speed (n) of said feed screw (5) in accordance with the formula: $\Delta n = -\Delta C + \Delta D$, wherein $\Delta n$ is the adjustment to the rotation speed (n) of said feed screw (5), said regulating means being operable to adjust the temperature (T) of said heating means (8) in accordance with the formula: $\Delta T = -\Delta C - \Delta D$, wherein $\Delta T$ is the adjustment to the temperature (T) of said heating means (8).

* * * * *